(12) United States Patent
Dean et al.

(10) Patent No.: US 6,291,987 B1
(45) Date of Patent: Sep. 18, 2001

(54) METHOD AND SYSTEM FOR DETECTING INCIPIENT FAILURES IN A POWER INVERTER

(75) Inventors: Jason A. Dean; Ajith K. Kumar; Kristopher L. Redinger, all of Erie; Bret D. Worden, Union City, all of PA (US)

(73) Assignee: General Electric Company

( * ) Notice: Subject to any disclaimer, the term of this patent is extended or adjusted under 35 U.S.C. 154(b) by 0 days.

(21) Appl. No.: 09/478,670

(22) Filed: Jan. 6, 2000

Related U.S. Application Data

(60) Provisional application No. 60/161,973, filed on Oct. 28, 1999.

(51) Int. Cl.[7] ............ G01R 31/34; G01R 31/26; H01H 31/02; H02M 3/18
(52) U.S. Cl. ............ 324/158.1; 324/772; 324/537; 324/765; 324/164; 363/58; 363/55
(58) Field of Search ............ 324/164, 158.1, 324/765, 537, 772; 363/58, 55

(56) References Cited

U.S. PATENT DOCUMENTS

| | | | |
|---|---|---|---|
| 3,852,656 | * 12/1974 | Bourbeau | 363/58 |
| 4,384,248 | * 5/1983 | Matsuda et al. | 324/537 |
| 4,400,626 | * 8/1983 | Lacy | 307/66 |
| 4,633,241 | * 12/1986 | Casteel et al. | 340/645 |
| 4,675,799 | * 6/1987 | Suzuki et al. | 363/58 |
| 4,745,513 | * 5/1988 | McMurray | 361/56 |
| 4,843,533 | * 6/1989 | Roof et al. | 363/55 |
| 4,908,756 | * 3/1990 | Higashino | 363/58 |
| 4,926,306 | * 5/1990 | Ueda et al. | 363/58 |
| 4,953,069 | * 8/1990 | Braun et al. | 363/58 |
| 5,099,410 | * 3/1992 | Divan | 363/98 |
| 5,266,891 | * 11/1993 | Kumar et al. | 324/765 |
| 5,363,039 | * 11/1994 | Kumar et al. | 324/158.1 |
| 5,428,523 | * 6/1995 | McDonnal | 363/71 |
| 5,491,622 | * 2/1996 | Carosa | 363/56 |

\* cited by examiner

*Primary Examiner*—Glenn W. Brown
*Assistant Examiner*—Wasseem H. Hamdan
(74) *Attorney, Agent, or Firm*—Carl A. Rowold; Beusse Brownlee Bowdoin & Wolter PA; Enrique J. Mora

(57) ABSTRACT

A method and system for predicting malfunctions in a power inverter having one or more legs connected between first and second voltage buses is provided. Each leg has respective first and second controllable switches coupled in series to one another. The method allows for applying predetermined respective voltages at the first and second buses. The method further allows for selectively actuating the first and second switches between respective conductive or non-conductive states. A monitoring step allows for monitoring predetermined electrical parameters generated in the inverter in response to the applied voltages as the first and second switches are respectively actuated, and an adjusting step allows for adjusting the respective values of the monitored electrical parameters for deviations from respective estimated nominal values due to predetermined external variables to generate adjusted electrical parameters that in turn may be used to determine the performance of the power inverter, including detection of incipient failures.

23 Claims, 6 Drawing Sheets

METHOD AND SYSTEM FOR DETECTING INCIPIENT FAILURES IN A POWER INVERTER

This application claims the benefit of provisional patent application Ser. No. 60/161,973 filed Oct. 28, 1999.

BACKGROUND OF THE INVENTION

This invention relates generally to a method and system for detecting malfunctions in AC motor power systems and, more particularly, to a method and system for detection of incipient failures in an inverter power circuit.

It is common in AC electric motor drive systems to employ power inverter systems to furnish electric power from a DC source to an AC motor. These inverter systems are of various types, but are often comprised of gate turnoff thyristors (GTO) in a bridge arrangement. The GTOs in the bridge are selectively gated to control the electrical power supplied to the motor by converting DC power from the DC source into AC power which drives the motor. Typically, two GTOs are connected in a series arrangement in what is commonly referred to as a "leg" between relatively positive and relatively negative busses of the DC source. A common converter of this type is a three-phase converter having three legs connected in mutual parallel between the positive and negative DC source busses. The GTOs of each of the legs are rendered conductive in a predetermined order or sequence in order to control the electrical power delivered from the DC busses to the AC motor.

The above described motor systems require regular maintenance to avoid or detect a variety of common failure modes. For example, if both GTOs of a leg were to become conductive simultaneously, there would exist a-short between the DC source busses which, if allowed to continue, could result in great damage to the motor, power source, and/or to the GTOs. In addition, failure of various components and segments of the system such as the feedback circuits, drive circuits, and the motor load itself can occur. Generally, expensive and time consuming manual off-line testing has been necessary to detect many errors at an early enough stage to ensure proper operation. U.S. Pat. No. 5,363,039 assigned in common to the same assignee of the present invention discloses self-test techniques for AC motor systems that enhance low-cost maintenance of such systems and that allow for detecting hard failures of the system, such as short circuits, prior to initiating operation of the inverter. In order to further enhance cost-effective maintenance of such systems, it would be desirable to provide techniques that allow for early detection of incipient failures in the system. It would be further desirable to monitor predetermined electrical parameters of the system so as to be able to, for example, detect trends that may be indicative of such incipient failures. It would also be desirable to be able to compensate for deviations from the predicted values of the monitored parameters due to various external parameters, such as ambient temperature, tractive load, traction motor RPM, etc. If uncompensated, such deviations could lead to mistakenly logging faults for the system and in turn this could lead to costly delays and added costs due to unnecessary maintenance.

SUMMARY OF INVENTION

Generally speaking, the present invention fulfills the foregoing needs by providing a method for predicting malfunctions in a power inverter having at least a first leg connected between first and second voltage buses, each leg having respective first and second controllable switches coupled in series to one another. The method allows for applying predetermined respective voltages at the first and second buses. The method further allows for selectively actuating the first and second switches between respective conductive or non-conductive states. A monitoring step allows for monitoring predetermined electrical parameters generated in the inverter in response to the applied voltages as the first and second switches are respectively actuated, and an adjusting step allows for adjusting the respective values of the monitored electrical parameters for deviations from respective estimated nominal values due to predetermined external variables to generate adjusted electrical parameters that in turn may be used to determine the performance of the power inverter, including detection of incipient failures.

The present invention further fulfills the foregoing needs by providing a system for predicting malfunctions in a power inverter having at least a first leg connected between first and second voltage buses, each leg having respective first and second controllable switches coupled in series to one another. The system includes means for applying predetermined respective voltages at the first and second buses. The system further includes means for selectively actuating the first and second switches between respective conductive or non-conductive states. Monitoring means allows for monitoring predetermined electrical parameters generated in the inverter in response to the applied voltages as the first and second switches are respectively actuated, and adjusting means allows for adjusting the respective values of the monitored electrical parameters for deviations from respective estimated nominal values due to predetermined external variables to generate adjusted electrical parameters that may be used to determine the performance of the power inverter, including detection of incipient failures.

BRIEF DESCRIPTION OF THE DRAWINGS

The features and advantages of the present invention will become apparent from the following detailed description of the invention when read with the accompanying drawings in which:

FIGS. 5A and 5B are diagrammatic illustrations of the inverter circuit operation and time dependant plots of voltage and current during one exemplary test wherein one GTO is turned on;

FIG. 6 is a diagrammatic illustration of the inverter circuit operation during another exemplary test wherein two GTOs are turned on; and FIG. 7 is a diagrammatic illustration of the inverter circuit operation during yet another exemplary test wherein three GTOs are turned on.

DETAILED DESCRIPTION OF THE INVENTION

Figure 1:
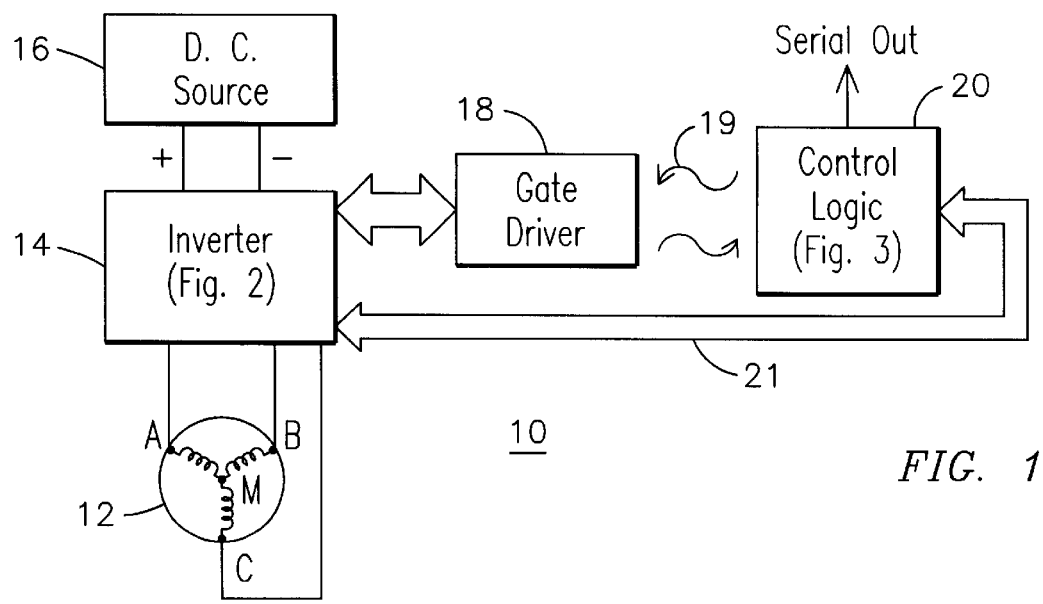
FIG. 1 is a generalized block diagram illustrating an exemplary AC motor drive system that can benefit from the method of the present invention for predicting malfunctions.

FIG. 1 is a block diagram of an exemplary embodiment of a three-phase, voltage source inverter driven motor system 10 with which the present invention may be used. System 10 is illustrated as including a three-phase AC motor 12 driven by a three-phase voltage source inverter 14 supplied by a DC power source 16. It will be recognized that the invention is applicable to a wide range of power converter-load configurations, for example, single phase converter and single phase motor; multiple motors in parallel driven by a single converter, transformer loads; and other inductive or resistive loads. Coupled to the inverter 14 is a gate driver module 18 which is controlled by a control logic circuit 20. In operation, the inverter 14 converts the DC power from DC source 16 into a three-phase excitation voltage for application to respective phase windings A, B and C of motor 12 in response to gate drive signals from gate driver module 18. The gate driver module 18 controls the switching of the inverter switching devices (i.e., GTOs) in the inverter 14 and is in turn controlled by the control logic circuit 20 via an optical control link 19 or other suitable signal link. In addition, feedback status signals from the GTO devices of the inverter 14 are coupled back to the gate driver module 18 and to the control logic circuit 20 via the optical link 19. Additional signals from current and voltage sensors of the inverter 14 are coupled to the control logic circuit 20 via a bus 21, as shown. The control logic circuit 20 uses the feedback values from the optical link 19 and the sensed current and voltage values via the bus 21 to perform the predictive method of this invention. In a typical application, such as a commuter rail car, the inverter 14 may be configured to drive two motors in parallel and a single control circuit may control a total of four motors.

Figure 2:
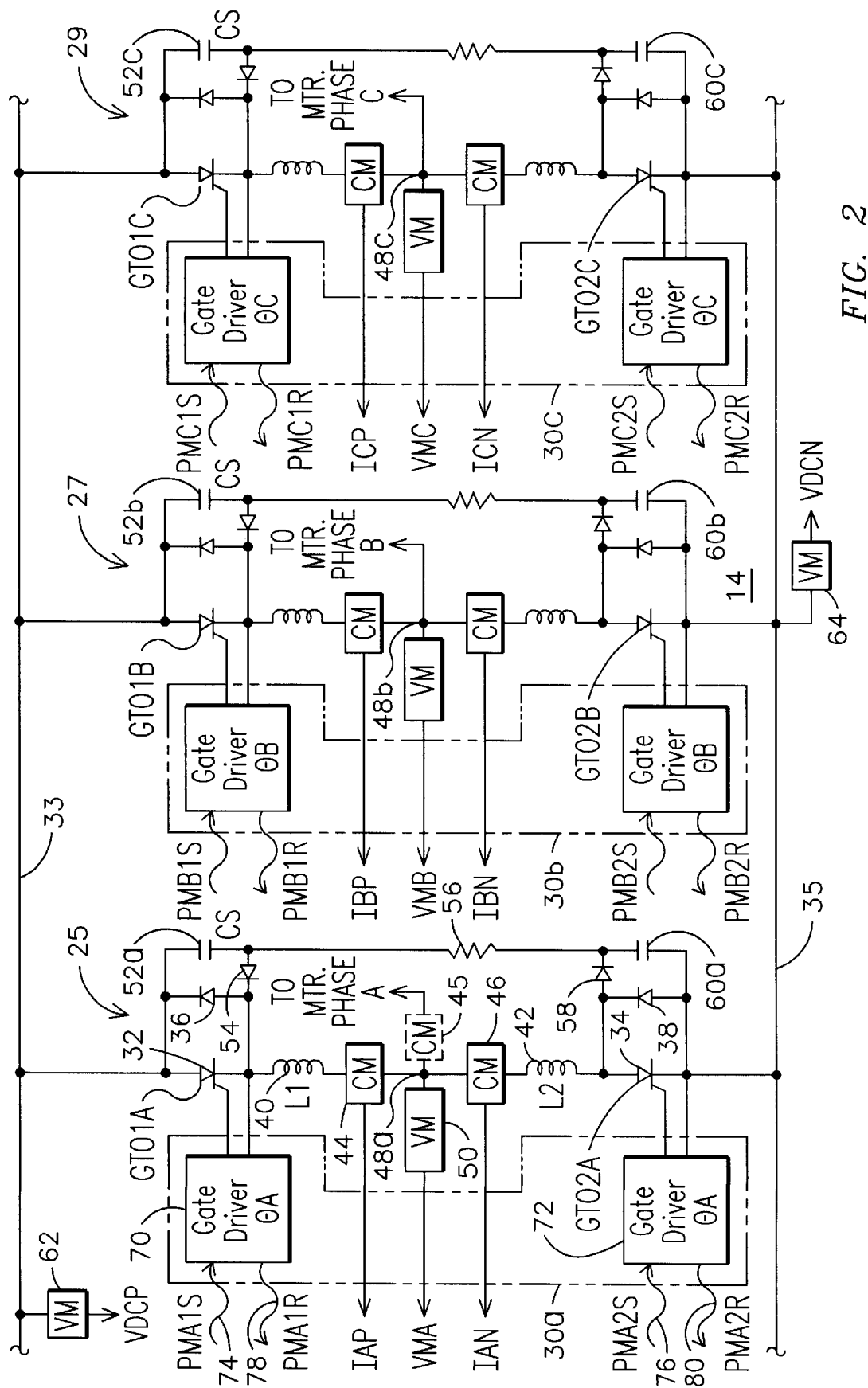
FIG. 2 is block diagram illustrating further details of the power inverter circuit shown in FIG. 1.

Referring now to FIG. 2, there is shown a detailed schematic diagram of a three-phase inverter 14 including gate driver circuits 30a, 30b and 30c that can benefit from the teachings of the present invention. As suggested above, inverter 14 comprises a first leg 25 (phase A) with an upper GTO 32 and a lower GTO 34 arranged in series with the anode of upper GTO 32 coupled to the positive DC source bus 33 and the cathode of the lower GTO 34 coupled to the negative DC source bus 35. The GTOs 32, 34 may typically be mounted on a heat sink with a temperature sensing thermal resistor (not shown) mounted thereon to detect overheating.

As will be understood by those skilled in the art, for each respective switch, e.g., GTOs 32 and 34, there is a respective anti-parallel-diode 36 and 38 connected from anode to cathode to provide a return path for inductive load currents. An upper inductor (L1) 40 (e.g., 5 h) and lower inductor (L2) 42 are coupled in series with the GTOs 32, 34. Also in series with the inductors L1, L2 are an upper current measurement circuit 44 (e.g., a Model LT1000-FI/SP45 Manufactured by LEM of Switzerland) and a lower current measurement circuit 46 which are connected at a Phase A node 48, as shown. The node 48 is coupled to one phase (phase A) of the three-phase motor (or motors) 12 and, as shown, to a conventional high impedance voltage measurement circuit 50. The current measurement circuits 44, 46 thus generate current measurement signals IAP and IAN to be coupled to the control logic circuit 20 via bus 21 or to any suitable current monitor device. The current measurement circuits may alternately be implemented with a single current measurement circuit 45 coupled in series between the node 48 and the motor phase A. The voltage measurement circuit 50 generates a voltage measurement signal VMA which is coupled to the control logic circuit 20 or to any suitable voltage monitor device.

A snubber circuit is also coupled to the phase A leg 25 and comprises a capacitor 52 and diode 54 coupled across the GTO 32 and a capacitor 60 (e.g., 3 f) and diode 58 coupled across the GTO 34, as shown. A resistor 56 (e.g., 0.25 ohms) provides a discharge path for snubber capacitors 52, 60.

Conventional high impedance voltage measurement circuits 62, 64 are coupled respectively to the positive DC voltage source bus 33 and negative DC voltage source bus 35 to provide a positive voltage source measurement signal VDCP and a negative voltage source measurement signal VDCN.

The gate driver circuit 18a comprises an upper gate driver 70 and a lower gate driver 72, each of which is coupled to the gate and cathode of the respective GTO 32, –34, as shown. The gate drivers 70, 72 provide drive signals to the gates of the GTOs 32, 34 to turn them on and off at the proper time. The gate drivers 70, 72 also detect whether the GTO actually did turn on or off in response to the signal (i.e., gate status feedback). In addition, each gate driver 70, 72 is coupled to the control logic circuit 20 via conventional optical couplers to permit input of gate command signals (PMA1S, PMA2S) from the control logic circuit 20 on respective input channels 76, and to send gate status feedback signals (PMA1R, PMA2R), indicating whether the GTO is turned on or off, back to the control logic circuit 20 on respective transmit channels 78, 80.

The inverter power circuit 14 of FIG. 2 further comprises two additional legs 27, 29 (i.e., phase B, phase C), which are substantially identical to phase A leg 25, and, for the sake of simplicity and brevity of description, their operational and circuit details will not be repeated. The phase B leg 27 is connected to the AC motor phase B and the phase C leg 29 is connected to the AC motor phase C while the input and output optical lines and measurement signals are coupled to the control logic circuit 20 as described with regard to the phase A leg 25.

Figure 3:
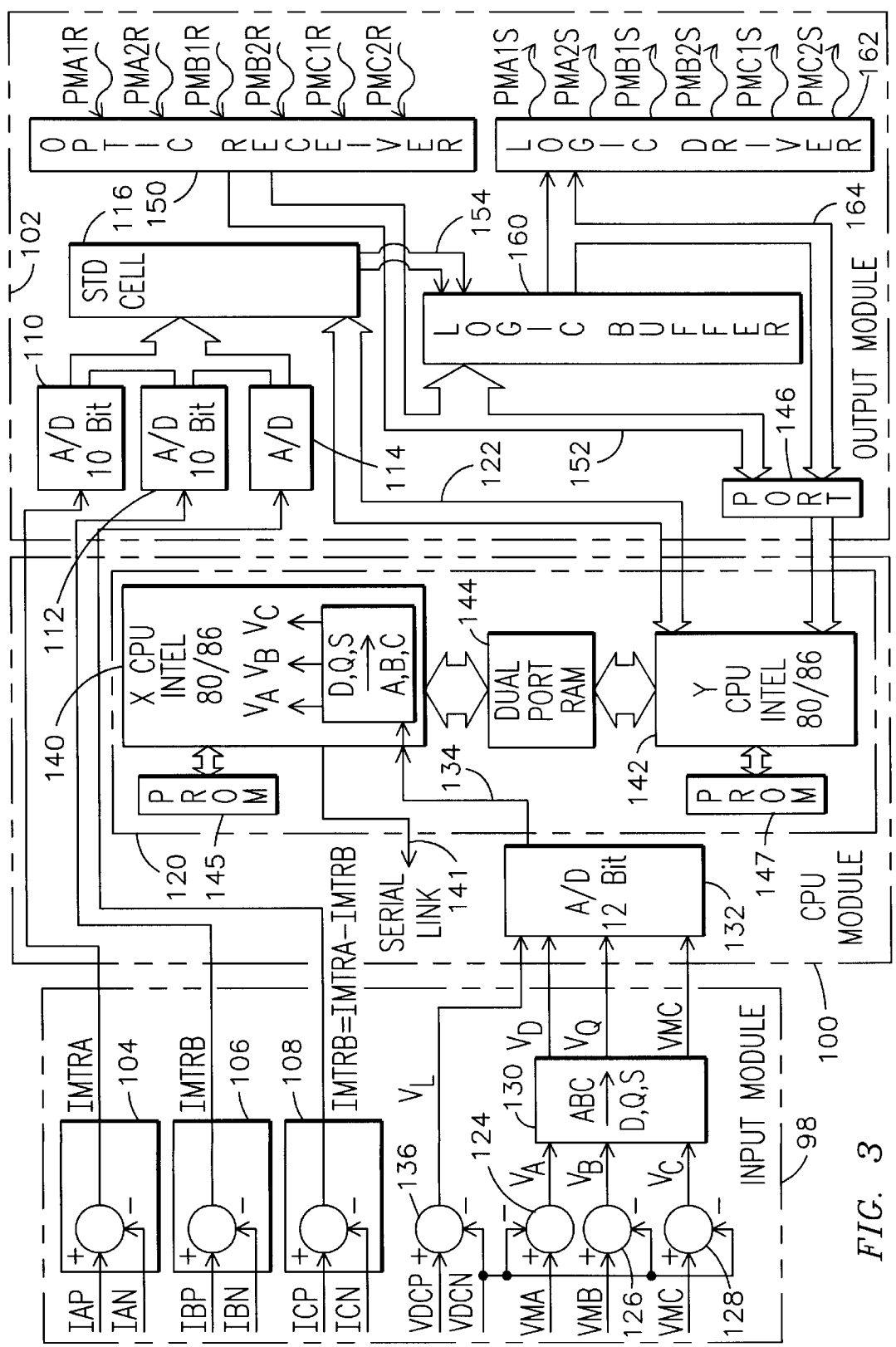
FIG. 3 is a detailed block diagram of the control logic shown in FIG. 1.

FIG. 3 is a block diagram illustrating further details of a control logic circuit 20 of FIG. 1, and is made up of three main blocks: an input module 98, a processor module 100 and an output module 102. The input module may include a conventional summing circuit 104 for phase A, a conventional summing circuit 106 for phase B, and an optional conventional summing circuit 108 for Phase C, each of which combines the respective upper and lower current measurement values to obtain a motor phase current value for the corresponding phase (i.e., IMTRA, IMTRB, IMTRC). Since IMTRC can be derived as the sum of the currents of phases A and B, summing circuit 108 is optional. In addition, if the optional single current measurement circuit 45 in the inverter 14 of FIG. 2 is used for each phase, no summing circuits are needed. In each case, the motor phase current value may be coupled from the input module 98 to suitable analog to digital (A/D) converters 110, 112 and optionally, to an A/D converter 114 in the output module 102. The A/D converters 110, 112, 114 convert the motor phase current values to digital form and couple them through a standard cell 116 to a processor 120 via a bus 122, as shown. Alternatively, the digitized signals can be coupled directly to the processor 120 from the A/D converters.

The input module also couples the voltage measurement values VMA, VMB, VMC from the inverter 14 to respective summing circuits 124, 126, 128, along with the negative DC source voltage measurement signal VDCM, as shown.

These summing circuits thus provide voltage measurement values (VMA, VMB, VMC) referenced to negative DC source bus 35 which are coupled to a converter circuit 130. The converter circuit 130 converts the signals from three-phase signals ($V_A$, $V_B$, $V_C$) to two-phase signals ($V_D$, $V_Q$, $V_{MS}$) which are coupled to an A/D converter 132 (e.g., a high speed, 12 bit A/D converter) of the processor module 100, as shown. Alternatively, the respective values of $V_A$, $V_B$, $V_C$ values be coupled directly to the A/D converter 132. The A/D converter 132 converts the input values of $V_A$, $V_B$, and $V_C$ to digital form and couples the digitized values to a processor 120 via a bus 134. The positive DC voltage bus measurement value VDCP from the inverter 14 is also coupled to the input module 98 and is coupled to a summing circuit 136 along with the negative DC voltage bus value VDCN. The summing circuit 136 generates a voltage difference signal $V_L$, representing the actual voltage source line voltage, which is also coupled to the A/D converter 132. The A/D converter 132 digitizes the value of $V_L$ and couples the digitized value to the processor 120, as shown.

The processor 120 of the processor module 100 may be a single microprocessor or it may be a dual processor architecture, such as illustrated, comprising an X processor 140 and a Y processor 142 both coupled to a dual port random access memory (RAM) 144. The processor 120 outputs signals via the bus 122 to the standard cell 116 of the output module 102 and communicates with external devices such as an external processor or a display (e.g. for health status messages, reports on the values of the various voltages and/or currents, etc.) via a serial link 141. In addition, inputs from a port 146 are coupled to the processor 120 from the output card 102. The processor 120 is controlled by a program stored in each PROM 145, 147 to process the input values from both the output module 102 and the input module 98 and generate output control signals coupled on the bus 122 to the standard cell 116 to control operation of the inverter-controlled motor system 10 during execution of the diagnostic techniques of the present invention.

The output module 102 may include a conventional optical receiver circuit 150 which receives the optical GTO status feedback signals (PMA1R, etc.) from the inverter driver module 18, and couples them in electrical form to a logic buffer circuit 160 via a bus 152. These signals are also coupled to the processor 120 via the port 146, as shown. In addition, gate firing pulses from the standard cell 116 are coupled to the logic buffer circuit 160 via a bus 154. The logic circuit 160 couples gate pulses (i.e., gate "on" or "off" command signals) to an optical driver 162 which generates optical gate command signals (PMA1S, etc.) which are coupled via the optical channel to the inverter 14. In addition, the gate command signals from the logic buffer circuit 160 are coupled via a bus 164 to the processor 120 via the port 146, as shown.

In normal operation, the control logic circuit 20 generates gate command signals which are coupled to the gate driver module 18. The microprocessor 120 of the module 100 controls generation of gate firing pulses by providing gate firing control signals to the standard cell 116 via the bus 122. The standard cell 116 generates gate firing control pulses in response to the gate firing control signals from the microprocessor 120. These gate firing control pulses are coupled to the logic buffer 160 via the bus 164 which couples gate command signals to the optical driver 162 for transmission to the gate driver module 18. The GTOs of the inverter 14 are then turned on and off by the gate driver module 18 at the appropriate times under the control of the gate command signals using technique well-understood in the art. Additionally, gate status feedback signals received from the optical receiver 150 are coupled to the logic buffer 160 which utilizes them to determine if the GTOs actually switched, as commanded, in order to prevent unwanted conditions, such as having both upper and lower GTOs turned on at the same time.

Figure 4:
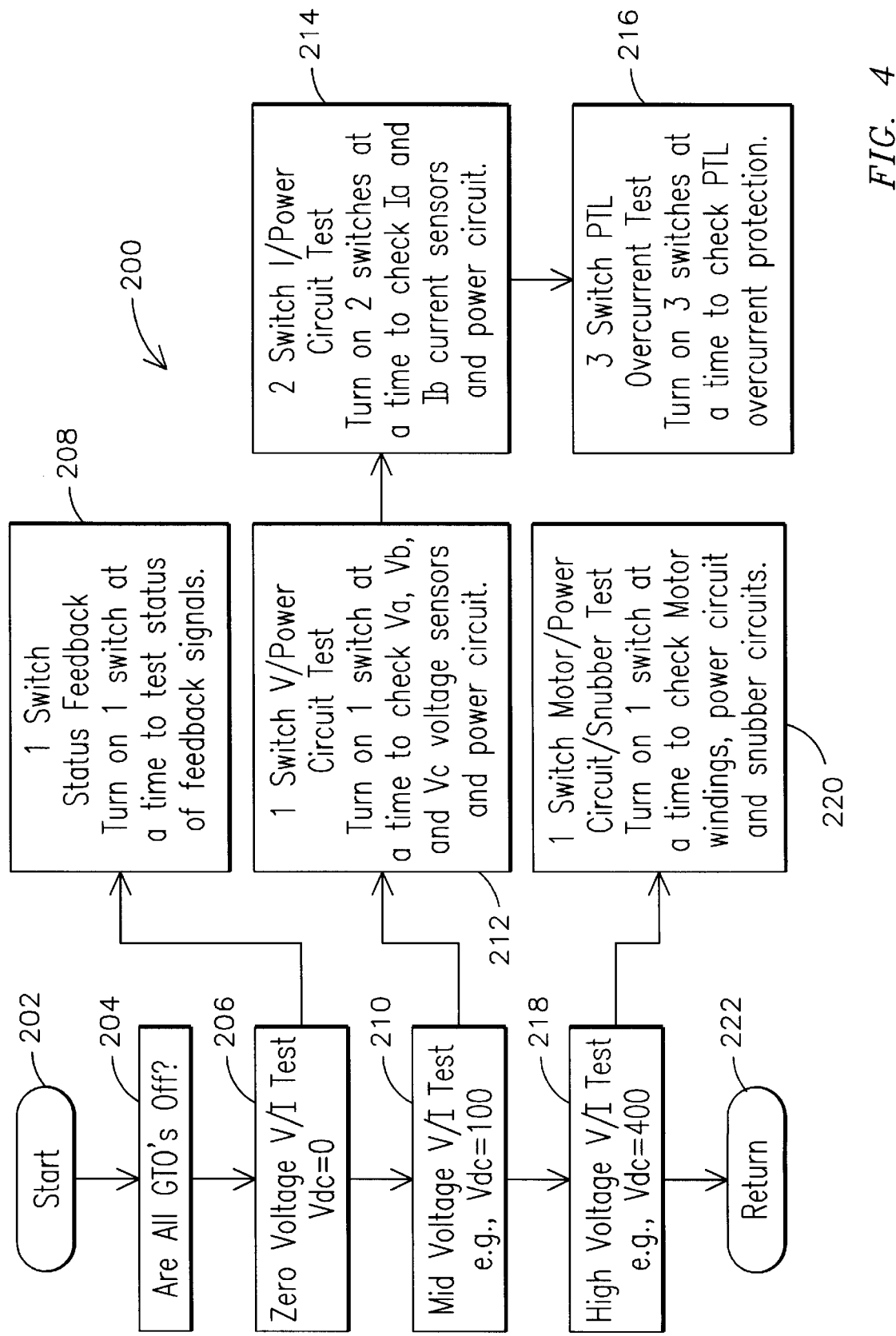
FIG. 4 is a flowchart illustrating various exemplary tests conducted on the power inverter.

FIG. 4 illustrates an exemplary flow chart 200 of various conditions during which the voltage and current parameters may be monitored in order to detect incipient failures in system 10 (FIG. 1). Upon start of diagnostics operations at step 202, step 204 allows for ensuring that each GTO is in a respective nonconductive state. Step 206 allows for monitoring the respective values of the feedback signals when voltage buses 33 and 35 (FIG. 2) are set to substantially zero volts. As suggested at step 208, each GTO may be turned on one at a time in order to monitor the respective gate status feedback signal (PMAIR, PMAZR, etc.) of each respective GTO.

Step 210 allows for monitoring the respective voltage and current parameters when voltage buses 33 and 35 are set to a predetermined intermediate voltage level (e.g., 100 V) relative to the standard voltage normally supplied through respective buses 33 and 35. As suggested at 212, each voltage at junctions 48a, 48b and 48c (FIG. 2) may be monitored as each respective GTO is turned on one at a time. As suggested at 214, respective currents flowing through at least two of the motor phases may be monitored either using the single current meter 45, or the combined measurements from current meter 44 and 46 (FIG. 2) when two GTOs are simultaneously turned on. It is noted that no two GTOs in a respective leg are simultaneously turned on, since as explained above, this would electrically short the two respective voltage source buses to one another and could result in substantial damage to the power inverter system. As suggested at 216, an overcurrent protection test may be performed while three GTOs are simultaneously turned on subject to the same precaution above of not simultaneously turning on two GTOs in the same leg. Prior to return step 222, step 218 allows for monitoring the respective voltage and current parameters when voltage buses 33 and 35 are set to a relatively high voltage level (e.g., 400V). As suggested at 220, the monitoring of electrical parameters at the high voltage level may be performed while activating each GTO to a respective conductive state one at a time, or the monitoring may be performed as described in the context of step 210 that allows for activation of more than one GTO at a time provided no two GTOs are part of a common circuit leg.

Figure 5A:
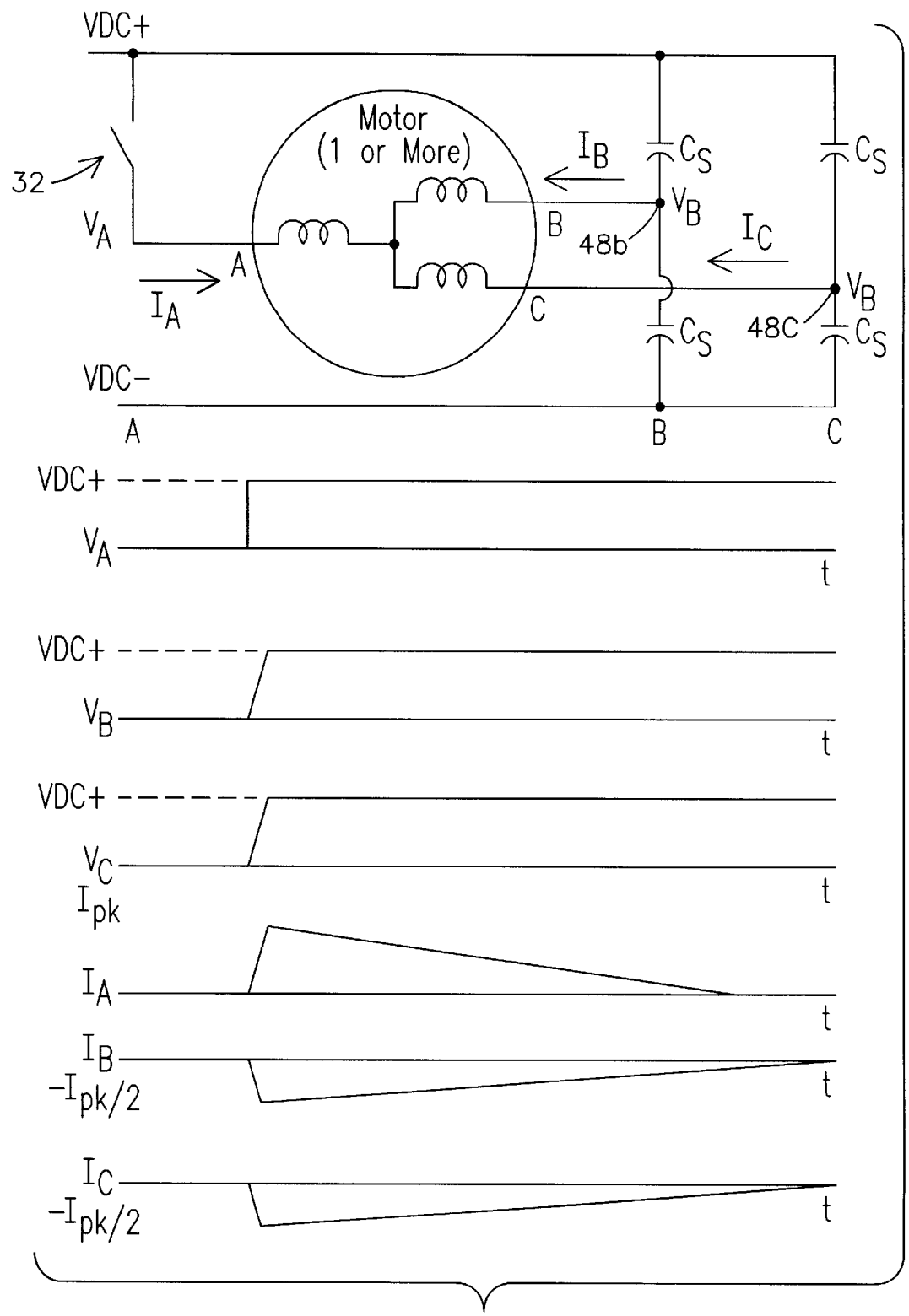
Figure 5B:
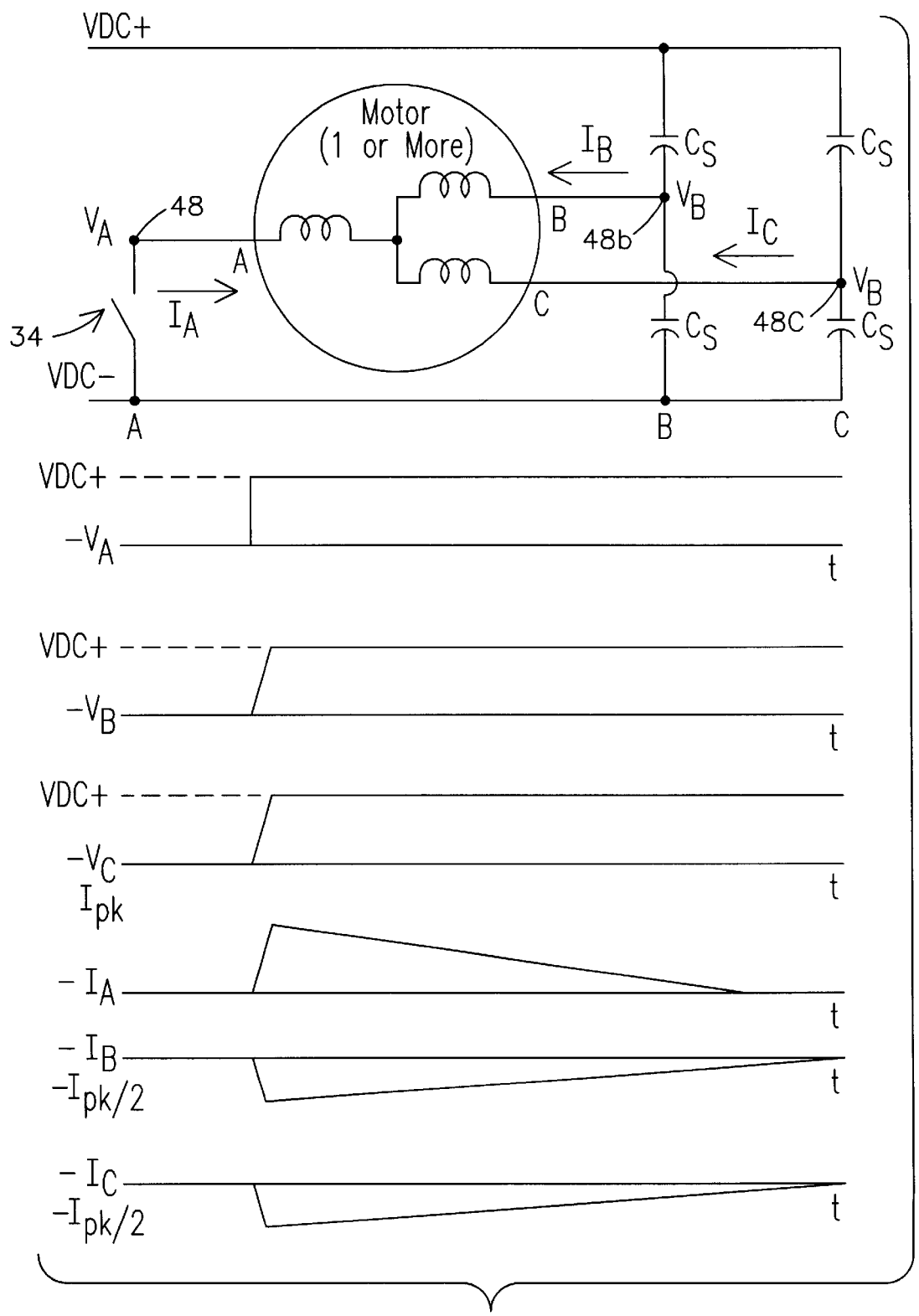

FIGS. 5a and 5b illustrate operation of the inverter when one GTO is turned on at a time and, in particular, FIG 5a illustrates inverter operation including associated voltage and current time plots when upper GTO 32 is activated in a respective conductive state. Conversely, FIG. 5b illustrates inverter operation including associated voltage and current time plots when lower GTO 34 is activated in a respective conductive state.

In each case, the respective electrical parameters that are monitored, e.g., voltage parameters VA, VB and VC; and peak current parameter Ipk may be compensated for deviations from a nominal value due to predetermined external variables, such as ambient air temperature, barometric pressure, traction motor states temperature, traction motor rotor temperature, motor RPM, inverter air flow, inverter age, expected variation from locomotive-to-locomotive, etc. The compensation may be accomplished through the use of respective transfer functions that may be experimentally or empirically derived. It will be appreciated that once an initial transfer function has been defined, suitable adaptive learning algorithms may be employed to fine tune the adjusting factors used in the transfer function. By way of example and not of limitation, the transfer function may be of the form listed below:

$$V\mathrm{comp} = V\mathrm{raw} * K1 * K2 \ldots * Kn$$

wherein K1, K2 through Kn represent respective correcting factors, for each external variable, assuming a number of n external variables, Vraw represents the raw measurements or the uncompensated values of the monitored electrical parameters and Vcomp represents the compensated values of the electrical parameters. It will be appreciated that in the general case, $V_{comp}=V_{raw}f(K_1K_2 \ldots K_n)$ and therefore the transfer function need not be limited to the product of the correction factors.

Once the monitored electrical parameters have been compensated, respective tolerance bands may be defined so that any compensated values that fall within a predetermined tolerance band may be indicative of incipient failures in the power inverter system.

By way of example, a tolerance band could be defined based on the following relationships for the monitored peak current Ipk so that if Ipk>(I nominal+1)/n or if Ipk<(I nominal−1)/n then the occurrence of Ipk values that exceed either of the above inequalities would be indicative of an incipient failure. In the above equation, the number 1 may represent a first range limit and n may represent a normalizing factor. Similarly, a second range limit (e.g., 2) may be chosen beyond the first range limit so that values of Ipk outside the second range would be indicative of unacceptable power inverter performance. In the foregoing example, Ipk values within the first range limit would be indicative of satisfactory inverter performance. Ipk values within the second and first range limits would be indicative of incipient failures and values exceeding the second range limit would be indicative of unacceptable system performance.

Thus, by suitably choosing the range limits for the compensated parameters, one may be able to detect failures at an early stage, as opposed to having to wait until a hard failure occurs. It will be appreciated that hard failures could result in a mission failure, such as train stoppage, whereas detection of an incipient failure would likely be pro-actively corrected without having to suffer the costly consequences associated with mission failures.

Figure 6:
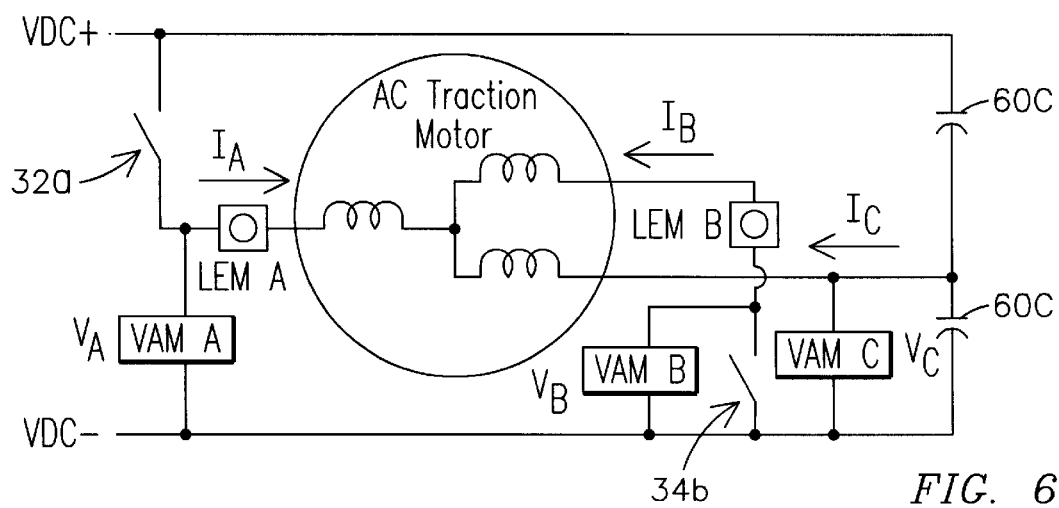

FIG. 6 illustrates operation of the inverter when two GTOs, e.g., GTOs 32a and 32b (are simultaneously turned on in a respective conductive state. In this case, it will be appreciated from basic circuit theory that under normal operating conditions IA=−IB and thus if the magnitude of the respective phase currents are not approximately equal to one another and their difference exceeds a predetermined current limit, (e.g., ±15 amps) then the user may declare an incipient failure. The ability to detect incipient failures becomes particularly powerful when used, not solely based on snapshots of the monitored parameters, but used with a timeline of the values of the monitored parameters. The timeline would allow for detecting trends in the monitored parameters that may be associated with respective incipient failures. In operation, the techniques of the present invention allow for predicting incipient failures by monitoring any trends in the monitored current parameters. It will be appreciated that the data monitored on-board each locomotive, that may be part of a large fleet of locomotives, may be transmitted to a remote diagnostic service center where dedicated analysis tools may be employed for analyzing the monitored parameters for detection of incipient failures, as well as recommendations to timely correct such incipient failures. Further, the monitored data need not be limited to electrical parameters since fault log data may also be monitored so as to enhance the predictive accuracy of the detection techniques of the present invention.

Figure 7:
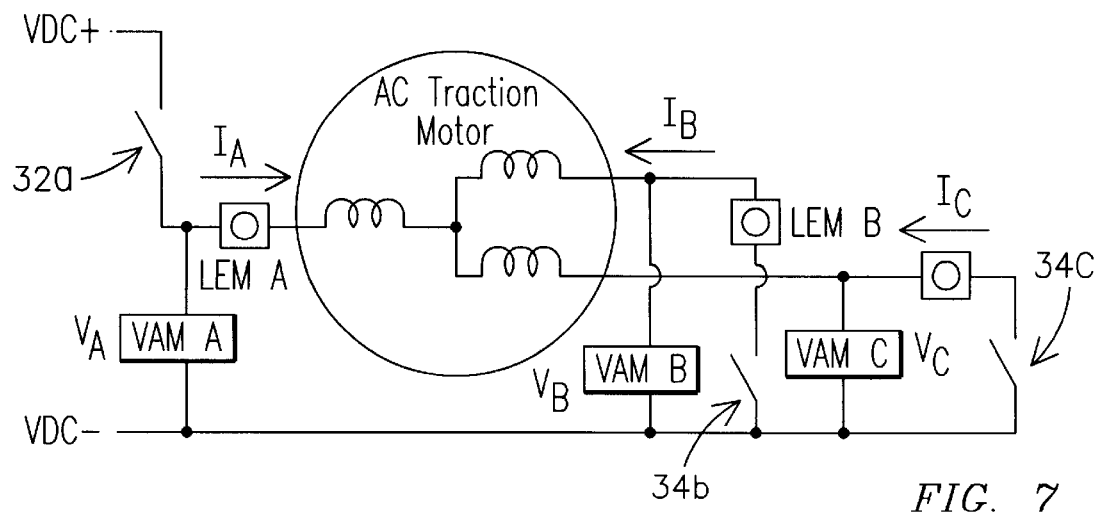

FIG. 7 illustrates operation of the inverter when three GTO, e.g., GTOs 32 a, 34b and 34c, are simultaneously turned on in a respective conductive state. In this case it will be appreciated that IA+IB+IC=O and thus if there is a predetermined non-zero current residual after summing the respective phase currents, then depending on the magnitude of such residual, the detection techniques of the present invention would allow for declaring either the presence of an incipient failure or the presence of unacceptable power converter performance. Conversely, if the value of the monitored electrical parameters are within an acceptable range, then one may conclude that the power inverter performance is acceptable.

It will be appreciated by those skilled in the art that during implementation of the algorithms for detecting incipient failures in the power inverter, the motors are stopped and the GTOs-are selectively turned on and off under control of the processor 120 using the foregoing techniques. As suggested above, the processor may include a compensation module that allows for compensation of deviations in the monitored voltages and currents due to predetermined external parameters. The processor then analyzes the voltages and currents measured during the test sequence and generates appropriate alert or warning messages if an incipient failure or abnormality is detected. As suggested above, the analysis of the monitored parameters need not be performed on-board the locomotive since the raw or compensated data could be transmitted to a remote diagnostic service center using a suitable wireless data transceiver for analysis at the service center. It will be further appreciated that such service center may be configured to handle respective data downloads for analysis from a fleet of locomotives.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A method for determining degradation of a power inverter having at least a first leg connected between first and second voltage buses, each leg having respective first and second controllable switches coupled in series to one another, the method comprising:

applying respective voltages at the first and second buses;

selectively actuating the first and second switches between respective conductive or non-conductive states;

sensing one or more electrical parameters generated in the inverter in response to the applied voltages with actuation of at least one of the switches, and generating a first set of electrical parameter values, with the electrical parameter values being influenced at least in part by a first set of operational and environmental conditions of the inverter;

determining at least one variable associated with the inverter at the time of the sensing of the electrical parameters, said at least one variable being indicative of the first set of operational and environmental conditions of the inverter;

providing a database of nominal inverter values based on data collected from a fleet of inverters corresponding to the inverter whose performance is being determined, the nominal inverter values constituting a second set of electrical parameter values relative to a second set of operational and environmental conditions for the inverters;

accessing the database in light of the first set of operational and environmental conditions;

adjusting the respective values of one of the first and second sets of parameter values relative to the other to account for differences between the first and second sets of operational and environmental conditions; and comparing the respective set of adjusted values against said other set of parameter values to determine the relative performance of the inverter to the fleet of inverters for detection of incipient failures of the inverter.

2. The method of claim 1 wherein the first set of parameter values is adjusted relative to the differences between the first and second sets of operational and environmental conditions.

3. The method of claim 1 wherein the second set of parameter values is adjusted relative to the differences between the first and second sets of operational and environmental conditions.

4. The method of claim 1 further comprising storing the adjusted values over time and determining trends in the adjusted values indicative of incipient failures of the inverter.

5. The method of claim 1 wherein said method is locally performed relative to the inverter.

6. The method of claim 1 further comprising transmitting the one or more electrical parameters generated by the inverter to a remote site and the comparing is performed at the remote site to determine the performance of the inverter.

7. The method of claim 1 wherein the step of sensing the one or more electrical parameters comprises sensing voltage at a node intermediate the switches.

8. The method of claim 1 wherein the step of sensing the one or more electrical parameters comprises sensing current flow through the at least one leg.

9. The method of claim 1 wherein the converter further comprises second and third legs in addition to the at last first leg, each node intermediate each serially connected first and second switches in each respective leg being coupled to a respective power input terminal of a three phase AC electric traction motor and wherein the actuation of the first and second switches of any of the legs comprises actuating any one switch of two different legs in a conductive state while each remaining switch remains in a nonconductive state.

10. The method of claim 9 further comprising a stop of storing a second range of values so that respective adjusted parameter values within that second range are indicative of incipient malfunctions of the inverter.

11. The method of claim 10 wherein respective adjusted parameter values beyond that second range of values are indicative of unacceptable inverter performance.

12. The method of claim 1 further comprising a step of storing a first range of values so that respective adjusted parameter values within that first range are indicative of satisfactory inverter performance.

13. The method of claim 1 wherein the variable of the inverter is selected from the group consisting of ambient air temperature, barometric pressure, traction motor stator temperature, traction motor rotor temperature, motor RPM, inverter air flow, system age, and expected variation from inverter-to-inverter.

14. A system for determining degradation of a power inverter having at least a first leg connected between first and second voltage buses, each leg having respective first and second controllable switches coupled in series to one another, the system comprising:

a module configured to apply respective voltages at the first and second buses;

a switch-actuation module configured to selectively actuate the first and second switches between respective conductive or non-conductive states;

at least one sensor configured to sense one or more electrical parameters generated in the inverter in response to the applied voltages with actuation of at least one of the switches, and further configured to generate a first set of electrical parameter values, with the electrical parameter values being influenced at least in part by a first set of operational and environmental conditions of the inverter;

a module for determining at least one variable associated with the inverter at the time of the sensing of the electrical parameters, said at least one variable being indicative of the first set of operational and environmental conditions of the inverter;

a database of nominal inverter values based on data collected from a fleet of inverters corresponding to the inverter whose performance is being determined, the nominal inverter values constituting a second set of electrical parameter values relative to a second set of operational and environmental conditions for the fleet of inverters;

a processor configured to access the database in light of the first set of operational and environmental conditions, the processor including;

an adjuster module configured to adjust the respective values of one of the first and second sets of parameter values relative to the other to account for differences between the first and second sets of operational and environmental conditions; and a comparator configured to compare the respective set of adjusted values against said other set of parameter values to determine the relative performance of the inverter to the fleet of inverters for detection of incipient failures of the inverter.

15. The system of claim 14 wherein the first set of parameter values is adjusted relative to the differences between the first and second sets of operational and environmental conditions.

16. The system of claim 14 wherein the first set of parameter values is adjusted relative to the differences between the first and second sets of operational and environmental conditions.

17. The system of claim 14 wherein said system is locally situated relative to the inverter.

18. The system of claim 14 further comprising a communications device configured to transmit the electrical parameters generated by the inverter to a remote site and the processor is located at the remote site to determine the performance of the inverter.

19. The system of claim 14 wherein the at least one sensor is configured to sense voltage at a node intermediate the switches.

20. The system of claim 14 wherein the at least one sensor is configured to sense current flow through the at least one leg.

21. The system of claim 14 further comprising memory for storing the adjusted values over time and determining trends in the adjusted values indicative of incipient failures of the inverter.

22. The system of claim 14 wherein the converter further comprises second and third legs in addition to the at least first leg, each node intermediate each serially connected first and second switches in each respective leg being coupled to a respective power input terminal of a three phase AC electric traction motor and wherein the actuation of the first and second switches of any of the legs comprises actuating any one switch of two different legs in a conductive state while each remaining switch remains in a nonconductive state.

23. The system of claim 14 wherein the variable of the inverter is selected from the group consisting of ambient air temperature, barometric pressure, traction motor stator temperature, traction motor rotor temperature, motor RPM, inverter air flow, system age, and expected variation from inverter-to-inverter.

* * * * *